(12) United States Patent
Tischler

(10) Patent No.: US 8,133,794 B2
(45) Date of Patent: Mar. 13, 2012

(54) SEMICONDUCTOR STRUCTURE AND METHOD OF MANUFACTURE

(75) Inventor: Michael Albert Tischler, Phoenix, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 154 days.

(21) Appl. No.: 12/330,763

(22) Filed: Dec. 9, 2008

(65) Prior Publication Data

US 2009/0148998 A1  Jun. 11, 2009

Related U.S. Application Data

(60) Provisional application No. 61/012,879, filed on Dec. 11, 2007.

(51) Int. Cl.
*H01L 21/76* (2006.01)
(52) U.S. Cl. ............... 438/422; 438/733; 257/E21.573
(58) Field of Classification Search .................. 438/422, 438/733; 257/E21.573
See application file for complete search history.

(56) References Cited

U.S. PATENT DOCUMENTS

| 6,057,202 | A  | * | 5/2000 | Chen et al. | 438/381 |
| 6,713,828 | B1 | * | 3/2004 | Chavan et al. | 257/415 |
| 7,811,935 | B2 | * | 10/2010 | Sandhu | 438/672 |
| 2005/0252282 | A1 | * | 11/2005 | Chand et al. | 73/105 |
| 2006/0081958 | A1 | * | 4/2006 | Averett et al. | 257/522 |
| 2007/0032092 | A1 | * | 2/2007 | Shibata et al. | 438/758 |
| 2007/0298586 | A1 | * | 12/2007 | Tanaka et al. | 438/455 |

* cited by examiner

*Primary Examiner* — Matthew Landau
*Assistant Examiner* — Sonya D McCall Shepard
(74) *Attorney, Agent, or Firm* — Cool Patent, P.C.

(57) ABSTRACT

In various embodiments, semiconductor structures and methods to manufacture these structures are disclosed. In one embodiment, a method includes removing a portion of a semiconductor material using an orientation-dependent etch to form a first cavity, a second cavity, wherein the first cavity is isolated from the second cavity, a first protrusion is between the first cavity and the second cavity, and the semiconductor material comprises silicon. The method further includes performing a thermal oxidation to convert a portion of the silicon of the semiconductor material to silicon dioxide and forming a first dielectric material over the first cavity, over the second cavity, over at least a portion of the semiconductor material, and over at least a portion of the first protrusion. Other embodiments are described and claimed.

12 Claims, 7 Drawing Sheets

SEMICONDUCTOR STRUCTURE AND METHOD OF MANUFACTURE

TECHNICAL FIELD

Embodiments disclosed in the present disclosure relate generally to electrical and semiconductor technology, and more specifically to a semiconductor structure that includes a dielectric structure.

BACKGROUND

For some applications, such as high frequency or radio frequency ("RF") applications, it may be contemplated to form integrated passive devices using semiconductor processing technology or it may be contemplated to integrate passive devices such as inductors and/or capacitors together with active devices such as transistors using conductive substrates. However, passive devices may have relatively low quality factors ("Qs") when these passive devices are formed on, or in relatively close proximity to, the conductive substrate. In addition, due to parasitic capacitive coupling between these passive devices and the conductive substrate, the frequency of operation of the integrated devices is reduced. Electrically conductive interconnects or busses may be used to electrically couple different devices within the die and external to the die. The frequency of operation may also be reduced by parasitic capacitive coupling between the interconnects and the conductive substrate.

Further, it may be contemplated to physically and electrically isolate regions of a semiconductor substrate from each other. Additionally, some semiconductor devices, such as power transistors, provide relatively high output power, which may be utilized in some RF, industrial, and medical applications. Power transistor designers are continually seeking ways to efficiently increase output power by varying the output voltage and current characteristics of a power transistor. For example, it may be desirable to have a power transistor that has an increased breakdown voltage to enable the power transistor to operate at a relatively higher voltage and provide a relatively higher output power.

Accordingly, it is utilized to have semiconductor structures, and methods to make these structures, that may provide for reduced parasitic capacitances, relatively higher frequencies of operation, relatively higher breakdown voltages, relatively higher quality factor passive devices, increased isolation, or combinations thereof.

Figure 1:
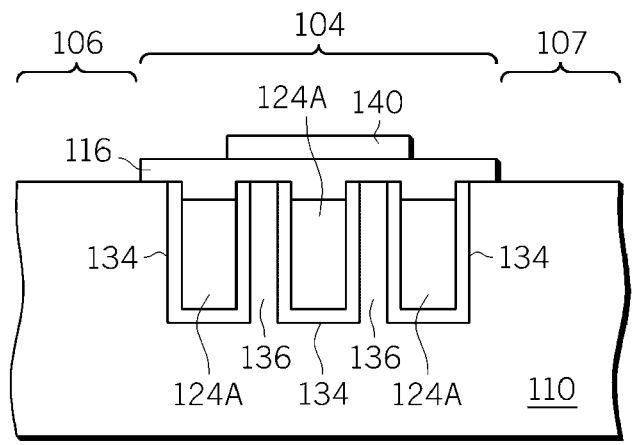
FIG. 1 is a cross-sectional view of a semiconductor structure in accordance with an embodiment of the present invention.

For simplicity of illustration and ease of understanding, elements in the various figures are not necessarily drawn to scale, unless explicitly so stated. Further, if considered appropriate, reference numerals have been repeated among the figures to indicate corresponding and/or analogous elements.

DETAILED DESCRIPTION

In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

FIG. 1 shows a cross-sectional view of semiconductor structure 100 that illustrates a dielectric platform (DP) 104, active regions 106 and 107, and an electrically conductive material 140. Dielectric platform 104 may be referred to as a dielectric structure or a dielectric region, and active regions 106 and 107 may also be referred to as active areas or active area regions or portions of active areas since active devices, or portions of active devices, are formed in active areas 106 and 107.

Dielectric platform 104 of semiconductor structure 100 comprises vertical structures 136, sealed voids 124A, dielectric materials 134, and dielectric structure 116 over vertical structures 136, sealed voids 124A and dielectric materials 134. As will be discussed further below, at least a portion of dielectric platform 104 may be between electrically conductive material 140 and substrate 110 to reduce parasitic capacitance between electrically conductive material 140 and substrate 110. In other embodiments of the present invention, at least a portion of dielectric platform 104 is between at least a portion of electrically conductive material 140 and at least a portion of substrate 110 to reduce capacitance between electrically conductive material 140 and substrate 110.

Active regions 106 and 107 are comprised of a portion of substrate 110. In some embodiments of the present invention, substrate 110 may be referred to as a device layer or an active layer. Further, in some embodiments, substrate 110 may include one or more epitaxial layers. Substrate 110 may be used as an active area where active devices, such as, for example, transistors or diodes, or portions of active devices, may be subsequently formed. Active devices may be formed in active regions 106 and 107 using conventional MOS (metal oxide semiconductor), complementary metal oxide semiconductor (CMOS), bipolar, or bipolar-CMOS (BiCMOS) processes.

Substrate 110 may comprise a semiconductor material such as, for example, silicon, and may be doped or undoped depending on the application.

Sealed voids 124A and dielectric materials 134 together reduce the dielectric constant of dielectric platform 104. To minimize the dielectric constant of dielectric platform 104 it is desirable to increase the depth of dielectric platform 104, increase the volume of sealed voids 124A and reduce the extent of semiconductor material 110 contained in vertical structures 136. Increasing the depth of dielectric platform 104 while minimizing the extent of semiconductor material 110 contained in vertical structures 136 requires formation of high aspect ratio structures with a relatively small width compared to the depth. Conventional methods to form such high aspect ratios generally use relatively expensive and difficult to control etching processes, for example reactive ion etching.

Figure 2:
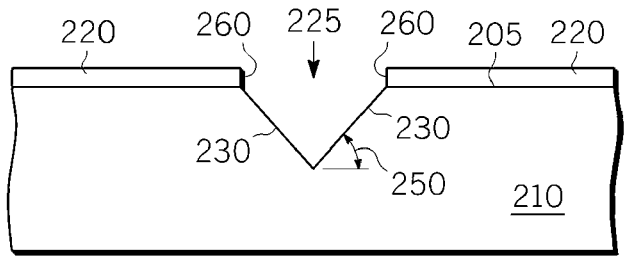
FIG. 2 is a cross-sectional view of another semiconductor structure; in accordance with an embodiment of the present invention.
Figure 3:
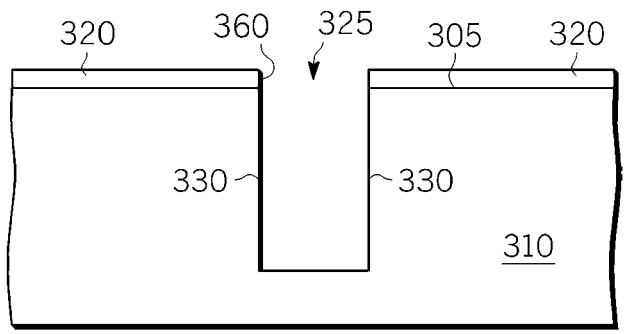
FIG. 3 is a cross-sectional view of the semiconductor structure in accordance with an embodiment of the present invention.

The dielectric platform fabrication method disclosed herein utilizes a much less expensive, self-controlling orientation-dependent etch, resulting in easier and less expensive processing, higher yield and the ability to produce dielectric platforms with lower dielectric constants. This method utilizes the different etch rates that certain etches, called orientation-dependent etches, have for different crystallographic planes in semiconductors. FIGS. 2 and 3 show cross-sectional views of semiconductor structures that have been formed using an orientation-dependent etch. Referring to FIG. 2, which shows a cross-sectional view of a semiconductor structure 200, the combination of the orientation of the crystal lattice in a substrate 210, the orientation of the edges 260 of a mask material 220 relative to the crystallographic axis in substrate 210 and the orientation-dependent etch form cavity 225 in which sidewalls 230 are at an angle 250 to surface 205 of substrate 210. FIG. 3 shows a cross-sectional view of a semiconductor structure 300 in which the combination of the orientation of the crystal lattice in a substrate 310, the orientation of the edges 360 of a mask material 320 relative to the crystallographic axis in substrate 310 and the orientation-dependent etch form cavity 325 in which sidewalls 330 are perpendicular to, or substantially perpendicular to surface 305 of substrate 310. These profiles occur because the orientation-dependent etch has significantly different etch rates for different crystallographic directions.

For example, in silicon, certain etches such as those based on potassium hydroxide (KOH), ethylene diamine pyrocatechol (EDP), tetramethylammonium hydroxide (TMAH) or hydrazine, have very low etch rates for the <111> direction of the silicon crystal lattice compared to other directions, for example the <100> or <110> directions. In one example, substrate 210 in FIG. 2 comprises silicon, edges 260 of mask material 220 are parallel to, or substantially parallel to the <110> direction of the crystal lattice of silicon substrate 210 and top surface 205 of silicon substrate 210 is perpendicular to, or substantially perpendicular to the <100> direction of the crystal lattice of silicon substrate 210 (this is the standard orientation for most silicon substrates used for device fabrication). Silicon substrate 210 is partially covered with masking material 220, exposing a portion of silicon substrate 210. When the exposed top portions of silicon substrate 210 are etched with an orientation-dependent etch, cavity 225 is formed. Because the etch rate is much slower in the <111> direction than in other directions, sidewalls 230 of cavity 225 are formed mainly by the {111} planes of the silicon crystal. Because sidewalls 230 are formed mainly by crystallographic planes, they are very flat and smooth. Angle 250 between surface 205 and face 230 (also the angle between the {100} and {111} crystallographic planes in silicon) is approximately 54.70 and the thus-formed sidewalls 230 of cavity 225 are formed at this angle without any further complicated masking or etching processes.

In a different example, substrate 310 in FIG. 3 comprises silicon, edges 360 of mask material 320 are parallel to, or substantially parallel to the <111> direction of the crystal lattice of silicon substrate 310 and top surface 305 of silicon substrate 310 is perpendicular to, or substantially perpendicular to the <110> direction of the crystal lattice of silicon substrate 310. Silicon substrate 310 is partially covered with masking material 320, exposing a portion of silicon substrate 310. When the exposed top portions of silicon substrate 310 are etched with an orientation-dependent etch, cavity 325 is formed. Because the etch rate is much slower in the <111> direction than in other directions, sidewalls 330 of cavity 325 are formed mainly by the {111} planes of the silicon crystal. Because sidewalls 330 are formed mainly by crystallographic planes, they are substantially flat or planar and smooth. In this case, sidewalls 330 are formed perpendicular to, or substantially perpendicular to surface 305 of silicon substrate 310 without any further complicated masking or etching processes. As will be discussed in detail below, when substrate 310 comprises silicon, the geometry of the ends and floor of cavity 325 (perpendicular to the plane of FIG. 3) may not be rectilinear because of additional sets of non-perpendicular {111} planes which bound cavity 325.

It will be appreciated that, in view of the dielectric platform structure shown in FIG. 1, the use of specifically oriented substrates and mask openings in combination with orientation-dependent etches can be used to form high aspect ratio structures without the use of expensive and difficult to control etching processes, for example reactive ion etching.

Figure 4:
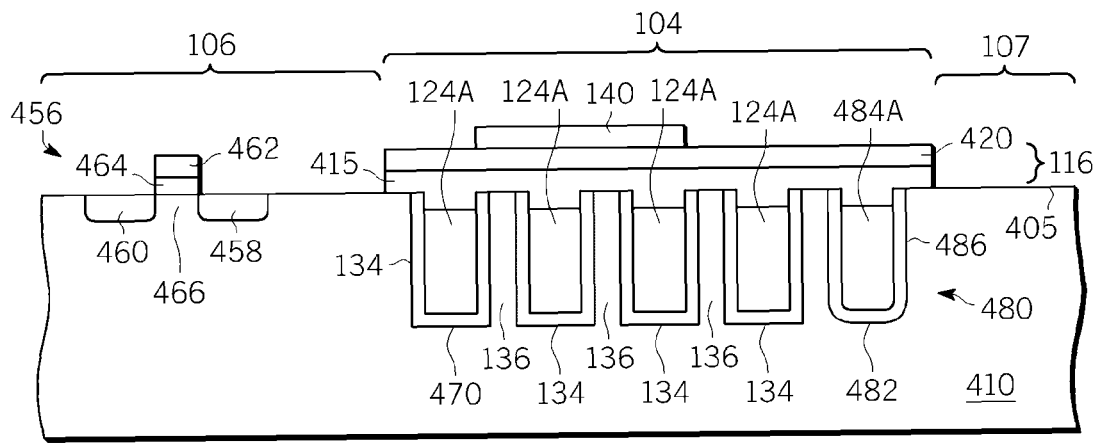
FIG. 4 is a cross-sectional view of another semiconductor structure in accordance with an embodiment of the present invention.

FIG. 4 shows a cross-sectional view of semiconductor structure 400, similar to that shown in FIG. 1, but fabricated using specifically oriented substrates and mask openings in combination with orientation-dependent etches. Semiconductor structure 400 illustrates a dielectric platform 104, active regions 106 and 107, and an electrically conductive material 140. Dielectric platform 104 may be referred to as a dielectric structure or a dielectric region, and active regions 106 and 107 may also be referred to as active areas or active area regions or portions of active areas since active devices, or portions of active devices, are formed in active areas 106 and 107.

Dielectric platform 104 of semiconductor structure 400 comprises vertical structures 136, sealed voids 124A, dielectric materials 134, and a dielectric structure 116 over vertical structures 136, sealed voids 124A and dielectric materials 134. Dielectric structure 116 is comprised of dielectric materials 415 and 420. As will be discussed below, at least a portion of dielectric platform 104 may be between electrically conductive material 140 and substrate 410 to reduce parasitic capacitance between electrically conductive material 140 and substrate 410. In other embodiments, at least a portion of dielectric platform 104 is between at least a portion of electrically conductive material 140 and at least a portion of substrate 410 to reduce capacitance between electrically conductive material 140 and substrate 410.

In some embodiments, the width of voids 124A, the thickness of dielectric material 415, and the type of material used for dielectric material 415 are selected so that dielectric material 415 is rigid or substantially rigid. In some applications of dielectric platform 104 it is desirable for dielectric material 415 to be stiff, unbending, or inflexible.

Layers 415 and 420 together may form a dielectric cap structure 116. In contrast to sensors comprised of a cavity and a flexible cap, dielectric structure 116 of dielectric platform 104 shown in FIG. 4 comprised of dielectric layers 415 and 420 may be designed to be rigid, or substantially rigid in some embodiments. In a sensor the cap is flexible and elements embedded in the cap or formed over the cap are designed to sense the flexure of the cap and provide a signal proportional to the cap flexure. Dielectric structure 116 may be designed to be rigid, or substantially rigid such that the values of elements that may be formed on or within structure 116 are constant, or substantially constant. As discussed in some of the examples herein, the size and spatial relationship between the elements which comprise the dielectric platform 104 may be designed to form a rigid cap. For example, referring to FIG. 4 the widths of sealed voids 124A and the thickness of dielectric layers 415 and 420 may be chosen such that structure 116 is rigid, or substantially rigid. In addition, one or more vertical structures 136 may be formed to increase the rigidity of structure 116. Vertical structures 136 may also be referred to as protrusions or projections. While the example in FIG. 1 shows four vertical structures 136, this is not a limitation of the present invention. Vertical structures 136 may be, for example, posts or pillars having various shapes such as, for example, circular, square, or hexagonal, and for example, may comprise open or closed walls or wall segments. While the example in FIG. 4 shows dielectric structure 116 comprised of two dielectric layers 415 and 420, this is not a limitation of the present invention. In other embodiments, dielectric structure 116 may include more or fewer dielectric layers.

In some embodiments, the depth or thickness of dielectric platform 104 may range from about one micron (µm) to about forty microns and the width of dielectric platform 104 may be at least about three microns or greater. The depth or thickness of dielectric platform 104 is measured from top surface 405 of substrate 410 to a lower boundary or surface 470 of dielectric platform 104. In some embodiments, lower surface 470 of dielectric platform 104 is parallel to, or substantially parallel to surface 405 of substrate 410. In some embodiments, lower surface 470 of dielectric platform 104 is at a distance of at least about one micron or greater below surface 405. In other embodiments, the thickness of dielectric platform 104 may be about ten microns and the width of dielectric platform 104 may be about ten microns. In other embodiments, it may be desirable that the thickness of the dielectric platform be equal to, or approximately equal to, the thickness of semiconductor structure 400, that is, the thickness of the die.

Sealed voids 124A may be referred to as sealed voids, sealed air gaps, sealed cavities, closed cavities, closed cells, or closed cell voids. In some embodiments, the width of sealed voids 124A ranges from about 0.5 to about 2.0 µm. In some embodiments, sealed voids 124A are hermetically sealed to prevent any contamination from undesirable gasses or moisture that may propagate into sealed voids 124A. Sealed voids 124A may be evacuated to a pressure less than atmospheric pressure. In other words, the pressure in sealed voids 124A is below atmospheric pressure. As an example, the pressure in sealed voids 124A may range from approximately 0.1 Torr to approximately 10 Torr. The type of substance or material within sealed voids 124A is not a limitation of the present invention. For example, sealed voids 124A may contain a gas, a fluid, or a solid matter.

Figure 13:
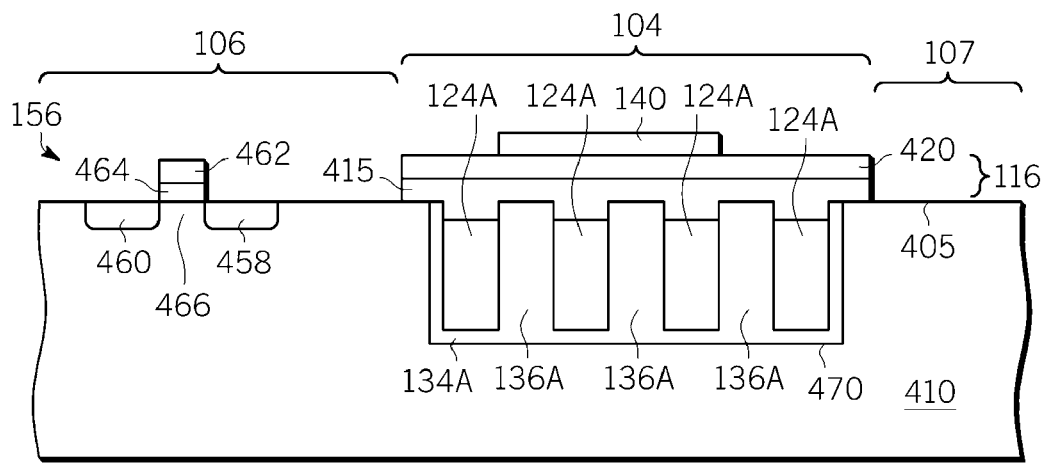
FIG. 13 is a cross-sectional view of another semiconductor structure in accordance with an embodiment of the present invention.

Vertical structure 136 may be, for example, a pillar or a wall, and may comprise a portion of substrate 410 and portions of dielectric material 134 between sealed voids 124A. As is discussed below, active devices, or portions of active devices, may be formed in substrate 410 and are not formed in material 410 of structure 136. In some embodiments, vertical structures 136 may comprise only dielectric material as shown in FIG. 13. FIG. 13 shows a cross-sectional view of semiconductor structure 1300 wherein vertical structures 136 (FIG. 4), referenced as dielectric structures 136A in FIG. 13, are formed completely of a dielectric material. In some embodiments dielectric structures 136A (FIG. 13) may be a part of dielectric material 134 (FIG. 4), referenced as 134A in FIG. 13. For example, as is discussed below, in some embodiments, a thermal oxidation may be performed to convert a portion of substrate 410 to silicon dioxide, thereby forming silicon dioxide layer or region 134A (FIG. 13) which includes structures 136A (FIG. 13).

Referring back to FIG. 4, vertical structures 136 may be used to form a plurality of sealed voids or closed cells in dielectric platform 104. Although three vertical structures 136 are shown in FIG. 4, the methods and apparatuses described herein are not limited in this regard. In other embodiments, fewer or more vertical structures may be formed in structure 400.

The combination of vertical structures 136, dielectric material 134 and sealed voids 124A reduces the overall permittivity of the dielectric platform 104 so that dielectric platform 104 has a relatively low dielectric constant. In some embodiments, a dielectric constant of about at least about 1.5 or lower may be achieved by increasing the volume of sealed voids 124A relative to the volume of vertical structures 136. The dielectric constant of dielectric platform 104 may also be reduced by increasing the volume of dielectric material 134 in vertical structures 136. Since empty space has the lowest dielectric constant (the dielectric constant of empty space is 1), the more empty space or void space incorporated into the dielectric platform, the lower the overall dielectric constant. Accordingly, increasing the volume of sealed voids 124A relative to the volume of vertical structures 136 is more effective in decreasing the dielectric constant of dielectric platform 104 compared to increasing the volume of dielectric material 134 in vertical structures 136.

The dielectric constant of dielectric platform 104 is reduced compared to, for example, what would be provided by a dielectric platform that has no air gaps or voids. Additionally, reduced thermal stress is induced in substrate 410 compared to a solid or filled dielectric structure (not shown), because dielectric platform 104 includes substantial volumes that are not occupied by solids having coefficients of thermal expansion that differ from that of substrate 410. Thermal stress can lead to dislocations and undesirable excessive leakage currents in devices formed in substrate 410. Reduced stress in dielectric platform 104 is also achieved by reducing the need for thick thermal oxide layers required in some alternate dielectric structures. Thick thermal oxides generate stress because of the 2.2× volume expansion that occurs when silicon is oxidized.

Silicon dioxide ($SiO_2$) has a dielectric constant of about 3.9. Accordingly, a solid or filled dielectric structure that includes no voids and includes silicon dioxide may have a dielectric constant of about 3.9.

In some embodiments described herein, dielectric platform 104 includes voids occupying in excess of 40% of the total volume of dielectric platform 104. This may result in an effective dielectric constant reduction of about 30% or greater, from a dielectric constant of about 3.9 to an effective dielectric constant of about 2.74. In one embodiment, dielectric platform 104 includes voids occupying in excess of 50% of the total volume. This may result in an effective dielectric constant reduction of about 39%, from a dielectric constant of about 3.9 to an effective dielectric constant of about 2.39. Increasing the volume of air or empty space in dielectric platform 104 may result in a dielectric platform 104 having a dielectric constant of about 1.5 or less. As a result, passive elements formed from conductive material 140 formed over dielectric platform 104 have reduced parasitic capacitances to substrate 410. The parasitic substrate capacitance is reduced by both the reduced effective dielectric constant of dielectric platform 104 and the increased thickness of dielectric platform 104.

Figure 5:
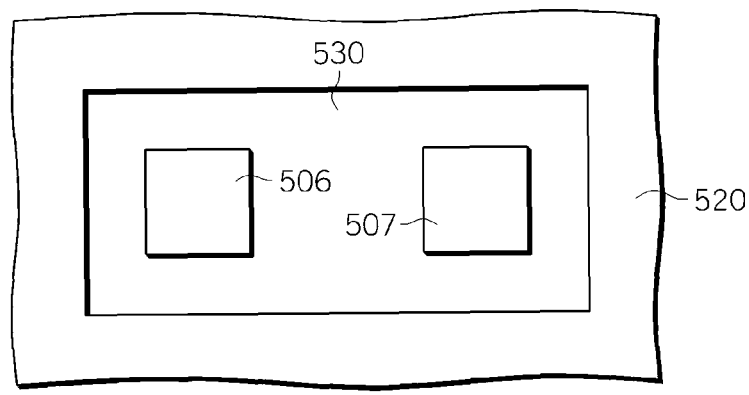
FIG. 5 is a plan view of another semiconductor structure in accordance with an embodiment of the present invention.

Dielectric platform 104 may also be used to provide electrical isolation in semiconductor structure 400. For example, dielectric platform 104 may provide electrical isolation between active region 106 and active region 107. In one example, dielectric platform 104 may be formed to completely surround either or both active regions 106 and 107. Turning briefly to FIG. 5, FIG. 5 is a top view showing a semiconductor structure 510 in which a single dielectric platform 530 completely surrounds active areas 506 and 507. Although rectangular shaped active areas 506 and 507 and a rectangular shaped dielectric platform 530 are illustrated in FIG. 5, this is not a limitation of the present invention. In other embodiments, dielectric platform 530 and active areas 506 and 507 may have any arbitrary shape. Although dielectric platform 530 illustrated in FIG. 5 is described as surrounding at both active areas 506 and 507, this is not a limitation of the present invention. In other embodiments, one or more dielectric platforms may surround none, or one or more of the active areas and/or one or more dielectric platforms may be formed adjacent to or abutting a portion of one or more active areas.

Turning back to FIG. 4, since at least a portion of dielectric platform 104 is formed in and below surface 405 of substrate 410, dielectric platform 104 may be referred to as an embedded dielectric structure. Embedded may mean that at least a portion of dielectric platform 104 is below a plane (not shown) that is coplanar to, or substantially coplanar to, top surface 405 of substrate 410. In some embodiments, the portion of dielectric platform 104 below the plane extends from the plane to a depth of at least about one micron or greater below the plane and the portion of dielectric platform 104 below the plane has a width of at least about three microns or greater. In other words, at least a portion of dielectric platform 104 is embedded in substrate 410 and extends a distance of at least about one micron or greater from upper surface 405 toward the bottom surface of substrate 410 and the portion of dielectric platform 104 embedded in substrate 410 has a width of at least about three microns or greater in some embodiments.

In addition, dielectric platform 104 may be used to increase the frequency of operation of any devices formed using semiconductor structure 400. For example, passive components such as, for example, inductors, capacitors, or electrical interconnects, may be formed over the embedded dielectric platform 104 and may have reduced parasitic capacitive coupling between these passive components and substrate 410 since the embedded dielectric platform 104 has a relatively low dielectric constant or permittivity and since the embedded dielectric platform 104 increases the distance between the passive components and the conductive substrate. Reducing parasitic substrate capacitances may increase the frequency of operation of any devices formed using semiconductor structure 400. As an example, the passive component may comprise electrically conductive material 140, wherein electrically conductive material 140 may comprise, for example, aluminum, copper, or doped polycrystalline silicon. In various examples, the passive component may be an inductor, a capacitor, a resistor, or an electrical interconnect and may be coupled to one or more active devices formed in active regions 106 and 107.

Further, dielectric platform 104 may be used to form relatively high quality passive devices such as, for example, capacitors and inductors having a relatively high quality factor (Q) since the dielectric platform 104 may be used to isolate and separate the passive devices from the substrate. Active devices, such as transistors or diodes, may be formed in regions adjacent to, or abutting, the dielectric platform 104, and these active devices may be coupled to and employ passive components such as spiral inductors, interconnects, microstrip transmission lines and the like that are formed on a planar upper surface of dielectric platform 104. Separating the passive components from substrate 410 allows higher Q's to be realized for these passive components.

As an example, a field effect transistor (FET) 456 may be formed in active region 106. FET 456 may be a MOSFET and may include a source region 458 in a portion of substrate 410, a drain region 460 in a portion of substrate 410, a gate dielectric 464 over a portion of substrate 410, a gate 462 over gate dielectric 464, and a channel region 466 formed in a portion of substrate 410 under gate dielectric 464 and between doped regions 458 and 460.

Substrate 410 may be electrically conductive and may serve as part of a drain region of a vertical transistor (not shown) formed in active region 107. In this example, a source contact or electrode (not shown) may be formed on or adjacent to an upper surface of substrate 410 and a drain electrode (not shown) may be formed on or adjacent to a lower surface of substrate 410. During operation, the electrical current flow from the source electrode to the drain electrode in the vertical transistor may be substantially perpendicular to the upper and lower surfaces of semiconductor substrate 410. In other words, current flows essentially vertically through the vertical transistor from the electrode located adjacent a top surface of semiconductor structure 400 to a drain electrode located adjacent to the opposite bottom surface of semiconductor structure 400. An example of a vertical transistor is described in U.S. patent application Ser. No. 10/557,135, entitled "POWER SEMICONDUCTOR DEVICE AND METHOD THEREFOR," filed Nov. 17, 2005, which claims priority to Patent Cooperation Treaty (PCT) International Application Number PCT/US2005/000205 entitled "POWER SEMICONDUCTOR DEVICE AND METHOD THEREFOR," having an International Filing Date of Jan. 6, 2005 and an International Publication Date of Jul. 28, 2005, the contents of both of these patent applications are incorporated herein by reference in their entirety.

Although only a single active device is discussed as being formed in active regions 106 and 107 of substrate 410, the methods and apparatuses described herein are not limited in this regard. In some embodiments, a plurality of active devices may be formed in active regions 106 and 107 of substrate 410.

Figure 6:
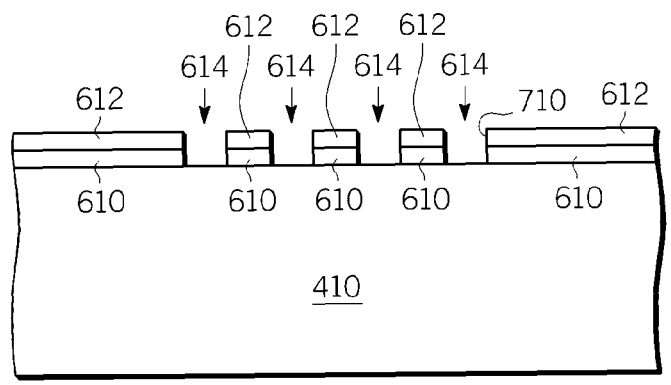
FIG. 6 is a cross-sectional view of the semiconductor structure of FIG. 4 at an early stage of fabrication, taken along section line 6-6 of FIG. 7.
Figure 7:
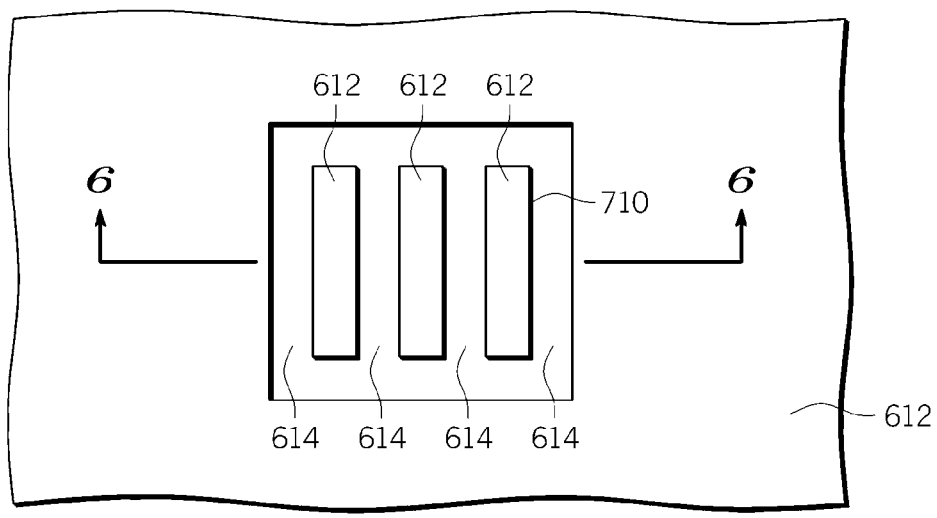
FIG. 7 is an example of a plan view of the semiconductor structure of FIG. 4 at an early stage of fabrication in accordance with an embodiment of the present invention.

FIGS. 6 to 15 illustrate at least one embodiment for making structure 400 of FIG. 4. Turning to FIGS. 6 and 7, FIG. 7 shows a top view of the semiconductor structure 400 of FIG. 4 at an early stage of fabrication and FIG. 6 shows a cross-sectional view of semiconductor structure 400 taken along section line 6-6 of FIG. 7. At the stage illustrated in FIG. 6, dielectric layer 610 is formed over substrate 410 and dielectric layer 612 is formed over dielectric layer 610. In one example dielectric layer 610 may be silicon dioxide and dielectric layer 612 may be silicon nitride. Dielectric layer 610 may comprise, for example, silicon dioxide and have a thickness ranging from about 50 Angstroms (Å) to about 5,000 Angstroms. Dielectric layer 610 may be formed using deposition techniques or thermal growth techniques such as, for example, thermal oxidation of silicon. Dielectric layer 612 may comprise, for example, silicon nitride ($Si_3N_4$) and have a thickness ranging from about 100 Angstroms (Å) to about 15,000 Angstroms. Dielectric layer 612 may be formed using deposition techniques, for example, low pressure chemical vapor deposition (LPVCD) of silicon nitride.

After dielectric layer 612 is formed, dielectric layer 612 and dielectric layer 610 may be patterned using photolithography and etching processes. Photolithography processes or operations involve the use of masks and may sometimes be referred to as masking operations or acts. The photolithography and etching may include forming a layer of a radiation-sensitive material, such as, for example, photoresist (not shown), over dielectric layer 612, then exposing the photoresist using, for example, ultraviolet (UV) radiation to form a mask, and then etching portions of dielectric layers 612 and 610 to form openings 614.

After dielectric layer 612 is formed, portions of layers 612 and 610 are removed to form openings 614. Openings 614 may be formed using at least one etching operation. In some embodiments, two etching operations may be used to form openings 614. In some embodiments, silicon nitride layer 612 may be etched using a wet chemical etch or a dry etch process such as, for example, a reactive ion etch (RIE). Silicon dioxide layer 610 may be etched using a wet chemical etch or a dry etch process such as, for example, a reactive ion etch (RIE). Dielectric materials 610 and 612 and openings 614 will be used as a mask for an orientation-dependent etch to remove a portion of substrate material 410 exposed by openings 614 to form sealed voids 124A (FIG. 4) of the resulting dielectric platform 104 (FIG. 4).

Dielectric layer 612 or a combination of dielectric layer 610 and dielectric layer 612 may serve as a hard mask, and may be referred to as a masking layer. Since the photoresist (not shown) over dielectric 612 may optionally be left in place during the orientation-dependent etch, it may also be etched as part of the etch used to etch portions of substrate 410. Dielectric layer 612 or a combination of dielectric layer 610 and dielectric layer 612 may be used as a hard mask to prevent the undesired etching of the upper surface of substrate 410 during the formation of openings 614 and subsequent removal of a portion of substrate 410 exposed by openings 614. In alternate embodiments, the photoresist layer may be made relatively thick such that it is not completely eroded during the etching process. Accordingly the thickness of dielectric material 610 or the combination of dielectric materials 610 and 612 must be large enough so that it is not completely removed during the orientation-dependent etch.

In an alternate embodiment, only dielectric material 610 may be formed (not shown). Dielectric layer 610 may comprise, for example, silicon dioxide and have a thickness ranging from about 1000 Angstroms (Å) to about 20,000 Angstroms. Dielectric layer 610 may be formed using deposition techniques or thermal growth techniques such as, for example, thermal oxidation of silicon. In this example, after patterning, the exposed portions of silicon dioxide layer 610 may be removed, for example by etching using a wet chemical etch or a dry etch process such as, for example, a reactive ion etch (RIE).

FIG. 7 shows a top view of semiconductor structure 400 at the stage of manufacture shown in FIG. 6. In one example where substrate 410 comprises silicon, openings 614 (FIG. 7) are aligned with their long edge 710 (FIG. 7) parallel to, or substantially parallel to the <111> direction of the crystal lattice in silicon substrate 410. In one embodiment, the alignment is better than ±1.0°; and in one example the alignment is better than ±0.1°.

The structure shown in FIG. 7 will result in the formation of sealed voids 124A (FIG. 4) that are all interconnected. Accordingly, if there is any rupture or fracture in dielectric platform 104 (FIG. 4), this rupture or fracture may affect the entire dielectric platform. In another embodiment, an example of which is shown in FIGS. 9 and 15, all of the sealed voids 124A (FIG. 4) are not interconnected.

Figure 9:
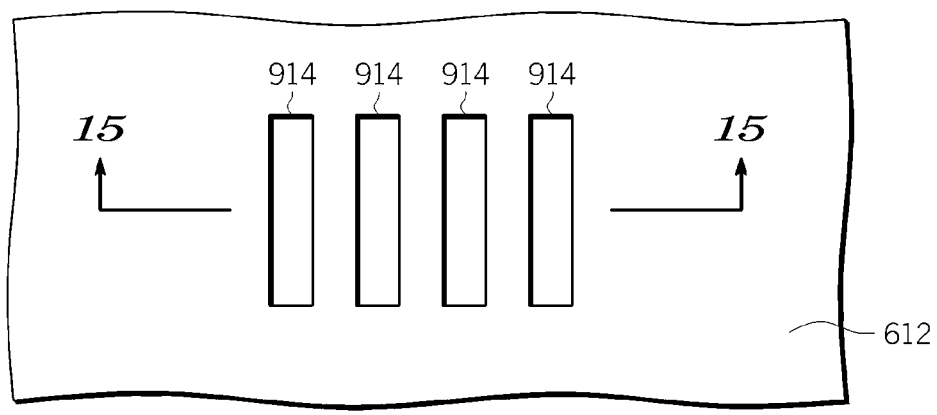
FIG. 9 is a plan view of another semiconductor structure at an early stage of fabrication in accordance with an embodiment of the present invention.
Figure 15:
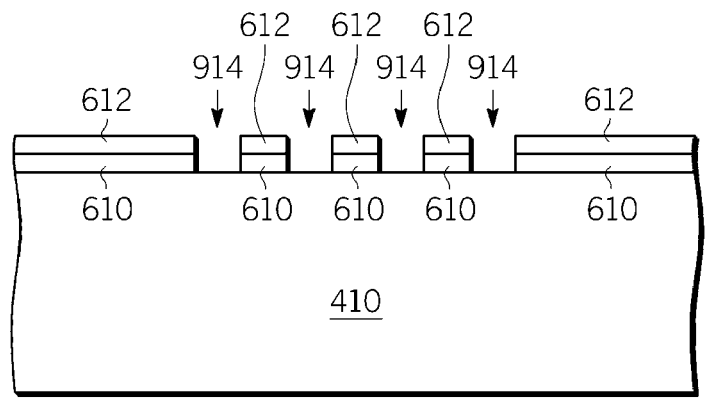
FIG. 15 is a cross-sectional view of the semiconductor structure of FIG. 9 taken along section line 15-15 of FIG. 9.

Turning to FIGS. 9 and 15, FIG. 9 shows a top view of a semiconductor structure 900 of FIG. 15 at the same stage of fabrication as that shown in FIG. 6 for semiconductor structure 400, and FIG. 15 shows a cross-sectional view of semiconductor structure 900 taken along section line 15-15 of FIG. 9. Semiconductor structure 400 is similar to semiconductor structure 900 of FIGS. 9 and 15 except that at the stage illustrated in FIGS. 9 and 15, each opening 914 is separate and not connected to another opening, resulting in subsequent formation of non-connected sealed voids 124A (FIG. 4). Accordingly, if there is any rupture or fracture in dielectric platform 104, the effects of this rupture or fracture may be contained in a limited area due to the closed-cell configuration, wherein the multiple voids of dielectric platform 104 are physically isolated from each other.

Although FIG. 7 shows an example leading to completely interconnected sealed voids and FIG. 9 shows an example of completely separate, non-connected sealed voids, the methods and apparatuses described herein are not limited in this regard. For example, dielectric platform 104 may comprise a combination of interconnected and non-interconnected sealed voids.

In embodiments wherein multiple voids are formed in dielectric platform 104, dielectric platform 104 may have a partially or fully closed-cell configuration in that one or more of the voids 124A (FIG. 4) of dielectric platform 104 may be physically isolated from each other by one or more vertical structures 136. Sealed voids 124A (FIG. 4) may be rectangular shaped, although the methods and apparatuses described herein are not limiting in this regard.

Figure 10:
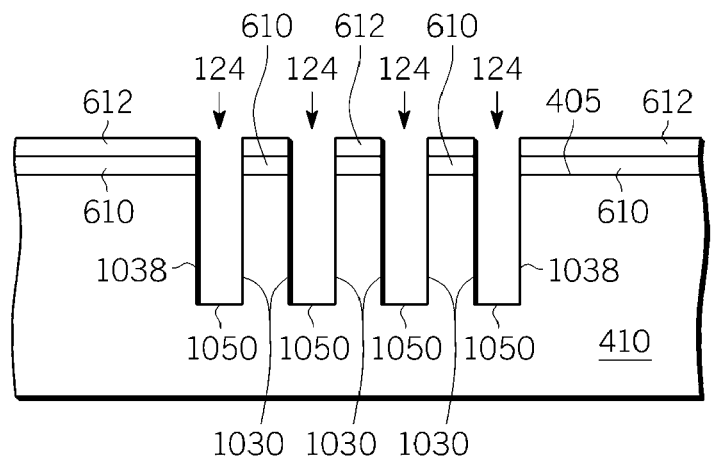
FIG. 10 is a cross-sectional view of the semiconductor structure of FIG. 6 at a later stage of fabrication.

Turning now to FIG. 10, FIG. 10 shows semiconductor structure 400 of FIG. 6 at a later stage of fabrication. After formation of openings 614 in dielectric layers 610 and 612, cavities 124 are formed in substrate 410. Cavities 124 may be referred to as cavities, open cavities, voids, open voids, openings, trenches, or air gaps. Sealed cavities 124A (FIG. 4) are formed from cavities 124. In the example of semiconductor structure 400, the orientation of the crystal lattice in substrate 410, the orientation of the mask pattern to form openings 614 (FIGS. 6 and 7) and the orientation-dependent etch are chosen to lead to the formation of cavities 124 in which the sidewalls 1030 and 1038 are perpendicular to, or substantially perpendicular to surface 405 of substrate 410. While the sidewalls 1030 and 1038 in FIG. 10 are perpendicular to, or substantially perpendicular to surface 405 of substrate 410, other sidewall profiles may also be utilized and the specific sidewall profile is not a limitation of the present invention. Furthermore, while FIG. 4 shows the tops of silicon structures 136 as coplanar, or substantially coplanar with surface 405 of substrate 410, the tops of silicon structures 136 may be coplanar, or above or below surface 405 of substrate 410. The relative height of silicon structures 136 with respect to surface 405 of substrate 410 is not a limitation of the present invention.

In one example, the semiconductor structure 400 in FIG. 10 may be realized with substrate 410 comprised of silicon oriented with the surface of silicon substrate 410 perpendicular to, or substantially perpendicular to the <110> direction of the crystal lattice of silicon substrate 410, the long edges 710 (FIGS. 6 and 7) of rectangular openings 614 (FIGS. 6 and 7) parallel to, or substantially parallel to the <111> direction of the crystal lattice of silicon substrate 410 and an orientation-dependent etch chosen, for example, from those based on potassium hydroxide (KOH), ethylene diamine pyrocatechol (EDP), tetramethylammonium hydroxide (TMAH) or hydrazine. These etches have very low etch rates for the <111> direction of the silicon crystal lattice compared to other directions, for example the <100> or <110> directions. The surface morphology of the etched surfaces, absolute etch rate in each crystallographic direction, and the relative etch rates in different crystallographic directions are dependent on the specific concentration of the etchant and the etchant temperature. In this example an etch rate ratio between the <100> and <111> directions is typically greater than 30:1, and in some cases greater than 100:1. Although a rectangular shaped mask opening is illustrated in this example, this is not a limitation of the present invention.

Figure 8:
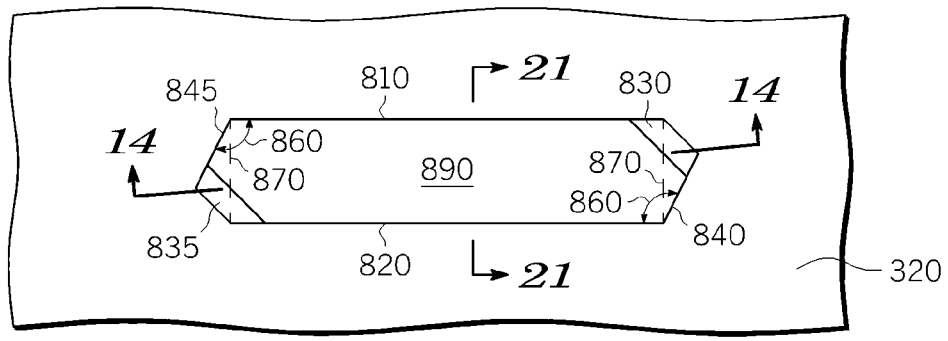
FIG. 8 is a plan view of another semiconductor structure in accordance with an embodiment of the present invention.
Figure 14:
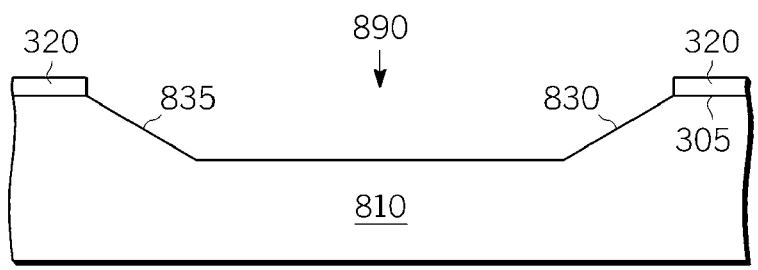
FIG. 14 is a cross-sectional view of the semiconductor structure of FIG. 8, taken along section line 14-14 of FIG. 8.
Figure 21:
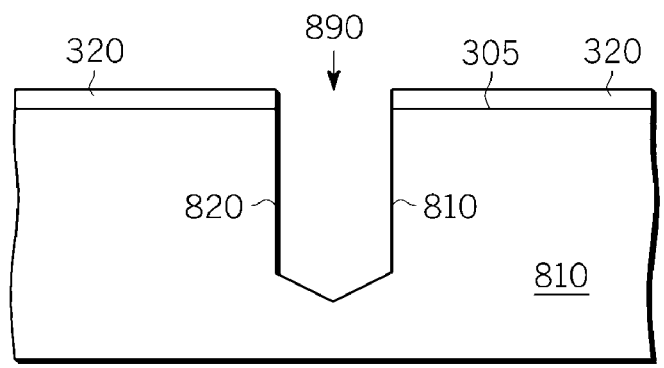
FIG. 21 is a cross-sectional view of the semiconductor structure of FIG. 8, taken along section line 21-21 of FIG. 8.

FIG. 8 shows a top view of one embodiment of a structure that may be used to form a semiconductor structure similar to semiconductor structure 400 (FIG. 4), where the substrate comprises silicon. FIG. 14 shows a cross-sectional view of FIG. 8 taken along section line 14-14 and FIG. 21 shows a cross-sectional view of FIG. 8 taken along section line 21-21. Referring now to FIG. 8, dotted lines 870 together with the intersection of faces 810 and 820 of cavity 890 with the surface of semiconductor structure 800 delineate a rectangular opening in mask material 320. After etching using an orientation-dependent etch, the resulting cavity 890 has long faces 810 and 820 formed mainly by {111} planes that are perpendicular, or substantially perpendicular to surface 305 (FIGS. 14 and 21), faces 840 and 845 formed mainly by {111} planes that are perpendicular to, or substantially perpendicular to surface 305 (FIGS. 14 and 21) and that form an angle 860 of approximately 109° with faces 810 and 820, and faces 830 and 835 formed mainly by {111} planes that form an angle of approximately 35° with surface 305 (FIGS. 14 and 21) and form an angle of approximately 125° with faces 810 and 820. FIG. 14 shows a cross-sectional view of FIG. 8 along section line 14-14 which shows the angle of faces 830 and 835 relative to surface 305. FIG. 21 shows a cross-sectional view of FIG. 8 along section line 21-21 which shows the angle of faces 810 and 820 relative to surface 305.

The non-perpendicular geometry in this example, where substrate 810 (FIGS. 14 and 21) comprises silicon, is a result of the fact that the sets of {111} planes that bound cavity 890 are not all perpendicular to each other and to surface 305. Although mask openings 614 (FIGS. 6 and 7) are shown as rectangular, and the long edge 710 of openings 614 (FIGS. 6 and 7) and the long faces 810 and 820 of cavity 335 (FIG. 8) are shown aligned parallel to, or substantially parallel to the <111> direction of the crystal lattice, the methods and apparatuses described herein are not limited in this regard. The shape of the mask openings may be arbitrary and the mask opening may have various orientations with respect to the crystal lattice.

Figure 11:
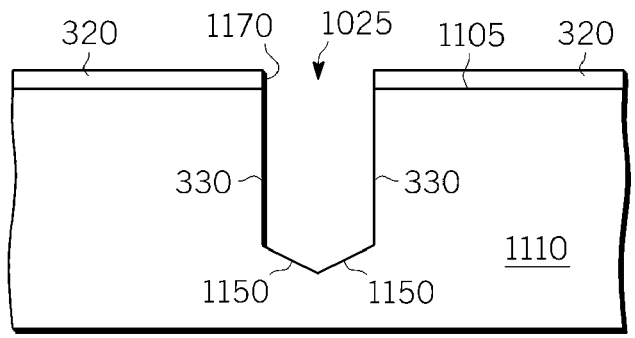
FIG. 11 is a cross-sectional view of another semiconductor structure in accordance with an embodiment of the present invention.
Figure 12:
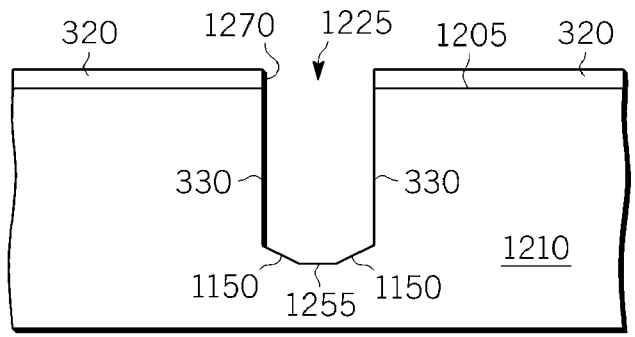
FIG. 12 is a cross-sectional view of another semiconductor structure in accordance with an embodiment of the present invention.

The floor 1050 of cavities 124 may or may not be perpendicular to sidewalls 1030 and 1038. The morphology of floor 1050 depends on the crystallographic orientation of substrate 410, the orientation and shape of openings 614 (FIGS. 6 and 7) and the specific concentration of the etchant and the etchant temperature. In one example, FIG. 11 shows semiconductor structure 1100 with substrate 1110 comprised of silicon, oriented with surface 1105 of substrate 1110 perpendicular to, or substantially perpendicular to the <110> direction of the crystal lattice of silicon substrate 1110, the long edges 1170 of cavity 1125 parallel to, or substantially parallel to the <111> direction of the crystal lattice of silicon substrate 1110 and an orientation-dependent etch chosen, for example, from those based on potassium hydroxide (KOH), ethylene diamine pyrocatechol (EDP), tetramethylammonium hydroxide (TMAH) or hydrazine. In this case the floor is comprised of two faces 1150 formed mainly by {311} crystallographic planes. FIG. 12 shows semiconductor structure 1200 with substrate 1210 comprised of silicon, oriented with surface 1205 of substrate 1210 perpendicular to, or substantially perpendicular to the <110> direction of the crystal lattice of silicon substrate 1210, the long edges 1270 of cavity 1225 parallel to, or substantially parallel to the <111> direction of the crystal lattice of silicon substrate 1210 and an orientation-dependent etch chosen, for example, from those based on potassium hydroxide (KOH), ethylene diamine pyrocatechol (EDP), tetramethylammonium hydroxide (TMAH) or hydrazine. In this case the floor is comprised of three faces including two faces 1150 formed mainly by {311} crystallographic planes and one face 1255 formed mainly by the {110} crystallographic plane. Typically the floor morphology changes from that shown in FIG. 12 to that shown in FIG. 11 with extended etching time.

The specific floor morphology is not critical as it does not have a significant impact on the dielectric properties of the dielectric platform. Thus the specific floor morphology is arbitrary and the examples described herein are not limiting in this regard.

Turning again to FIG. 10, in some embodiments exterior sidewalls 1038 of cavities 124 may serve as termination for equipotential lines during depletion of active devices formed in active regions 106 and/or 107. Thus, as is discussed further below, equipotential lines impinge on exterior sidewalls 1038. In other words, a termination structure comprising exterior sidewalls 1038 provides termination for equipotential lines from an electric field in an active area formed adjacent to the termination structure. It may be desirable for exterior sidewalls 1038 of openings 124 to be straight and smooth and perpendicular to surface 405 of substrate 410 so that the electric field lines are substantially perpendicular to exterior sidewalls 1038 so that a condition that is referred to as planar breakdown is achieved where equipotential lines terminate at a perpendicular angle, or a substantially perpendicular angle, to the exterior sidewalls 1038. Equipotential lines that impinge on exterior sidewalls 1038 at an angle that is not perpendicular to sidewalls 1038 may decrease the breakdown voltage of active devices formed in active region 106, active region 107, or both. In such an embodiment, it may be desirable to passivate exterior sidewalls 1038 with a high quality dielectric material 134, as discussed below and shown in FIG. 4.

In embodiments where it is desirable for equipotential lines of a depletion layer to terminate on a surface that is perpendicular, or substantially perpendicular to surface 405 of substrate 410, but the exterior sidewalls are not perpendicular, or substantially perpendicular to surface 405 of substrate 410, an optional dielectric termination structure 480 (FIG. 4) comprising a sealed cavity 484A and a dielectric layer 482 may be formed in substrate 410, as shown in FIG. 4. In some embodiments dielectric layer 482 may comprise silicon dioxide. Optional dielectric termination structure 480 may be part of dielectric platform 104 or may be laterally spaced apart from dielectric platform 104. In other embodiments, trench 484 (FIG. 16) may be filled with one or more dielectric materials (not shown) such as, for example, an oxide, a nitride, or undoped polysilicon.

Optional termination structure 480 has sidewalls 486 that are perpendicular, or substantially perpendicular, to the upper surface 405 of substrate 410. Termination structure 480 serves as termination for equipotential lines during depletion of active devices formed in active region 107. Thus, as is discussed above, equipotential lines impinge on dielectric sidewalls 486. In other words, termination structure 480 may provide termination for equipotential lines from an electric field in an active area formed adjacent to termination structure 480. It may be desirable for sidewalls 486 to be straight and smooth so that the equipotential lines are substantially perpendicular to sidewalls 486 so that a condition that is referred to as planar breakdown is achieved where equipotential lines terminate at a perpendicular angle, or a substantially perpendicular angle, to the oxide sidewalls 486. Equipotential lines that impinge on sidewalls 486 at an angle that is not perpendicular to sidewalls 486 may decrease the breakdown voltage of active devices formed in active region 107.

It should be noted that including dielectric termination structure 480 is optional. Termination structure 480 may be desirable in applications where high voltage and/or high power is desired and where the lateral boundaries of dielectric platform 104 do not include a sidewall that is perpendicular, or substantially perpendicular to upper surface 405 of substrate 410. For example, referring to FIGS. 8 and 14, sidewalls 830 and 835 are angled, and not perpendicular, to surface 305 (FIGS. 14 and 21) of substrate 810 (FIGS. 14 and 21). Accordingly, termination structure 480 (FIG. 4) may be included to provide a dielectric sidewall 486 (FIG. 4) that is perpendicular to, or substantially perpendicular to, surface 405 of substrate 410.

While the optional termination structure 480 shown in FIG. 4 is between dielectric platform 104 and active area 107, this is not a limitation of the present invention. Optional termination structures may be adjacent to a portion of one or more dielectric platforms, or may completely surround one or more dielectric platforms.

As is discussed below with reference to FIG. 4 dielectric material 134 is formed on the exposed surfaces of cavities 124 (FIG. 10). In one example, the dielectric material is silicon dioxide and is formed by thermal oxidation. In this example thermal oxidation is performed to convert a portion of, all of, or substantially all of, the silicon of structures 136, a portion of silicon substrate 410 adjacent to exterior walls 1038 and a portion of the silicon substrate 410 under floor 1050 of cavities 124 to silicon dioxide to form silicon dioxide layers 134 (FIG. 4). FIG. 4 shows an example where a portion of the silicon in vertical structure 136 has been converted to silicon dioxide. FIG. 13 shows an example where all or, or substantially all of the silicon in vertical structure 136 has been converted to silicon dioxide. In FIG. 13, vertical structure 136 is referenced as 136A and is comprised of silicon dioxide.

The width of silicon structure 136 is typically about 2.0 microns or less in some embodiments. It should be noted that the thicker the width of silicon structure 136, the longer it will take to fully oxidize silicon structure 136. The embodiment shown in FIG. 4 shows partially oxidized silicon structures 136. In an alternate embodiment, silicon structures 136 may be completely oxidized and converted to silicon dioxide, as referenced by 136A in FIG. 13. In addition, as shown in FIGS. 4 and 13, during the thermal oxidation process, the bottom of cavities 124 (FIG. 10), that is floor 1050 (FIG. 10), as well as portions of substrate 410 adjacent to exterior walls 1038, is also converted to silicon dioxide. Since the dielectric constant of silicon is greater than the dielectric constant of silicon dioxide, reducing the amount of silicon remaining in silicon structure 136 will reduce the effective dielectric constant of dielectric platform 104, but it may also increase the stress in the structure because of the 2.2× volume expansion that occurs upon oxidation of silicon.

The width of cavities 124 may be dependent on the method of capping, as discussed below. In the embodiment shown in FIG. 4, a non-conformal cap structure is used. In this case, the width of cavities 124 (FIG. 10) is small enough to permit sealing of cavities 124 (FIG. 10), thus forming sealed voids 124A, without completely filling cavities 124 (FIG. 10). Accordingly, the cavity width is selected so that after the thermal oxidation, oxide layers 134 do not touch inside sealed cavities 124A. In some embodiments, the width ranges from about 0.5 microns to about 2 microns. The width of cavities 124 is not a limitation of the present invention and may be adjusted to best match the method used for capping.

Figure 16:
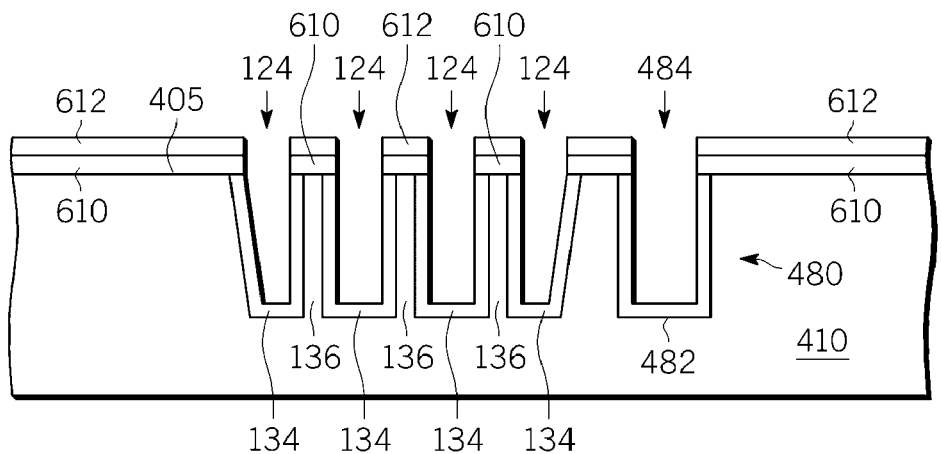
FIG. 16 is a cross-sectional view of the semiconductor structure of FIG. 15 at a later stage of fabrication, incorporating an optional termination structure.

Referring to FIG. 16 which shows semiconductor structure 400 at a later stage of fabrication, after the oxidation process is performed, if an optional termination structure 480 (FIG. 4) is required, dielectric layers 610 and 612, and semiconductor material 410 may be patterned and then portions of layer 612, layer 610, and semiconductor material 410 etched using an anisotropic etch process such as, for example, a reactive ion etch (RIE), to form a cavity 484 that surrounds or partially surrounds dielectric platform 104 (FIG. 4). Cavity 484 may also be referred to as an opening, a trench, a void, a gap, an empty region, an empty space, or the like. After cavity 484 is formed, a dielectric layer 482 is formed along the exposed interior surfaces of cavity 484. Dielectric layer 482 and cavity 484 form a dielectric termination structure 480 as is discussed above. In some embodiments, dielectric layer 482 is an oxide layer such as silicon dioxide having a thickness ranging from about 50 Angstroms to about 5000 Angstroms. Oxide layer 482 may be formed using deposition techniques or thermal growth techniques such as, for example, thermal oxidation of silicon. If a thermal oxidation process is used to form oxide layer 482 of optional termination structure 480, then other portions of structure 400 may also be affected by the oxidation. For example, the amount of silicon dioxide 134 formed on the interior surfaces of cavity 124 may be increased as part of this thermal oxidation. Further, in alternate embodiments, silicon structures 136 may be partially oxidized during the initial thermal oxidation described above, so that silicon structures 136 comprise silicon and silicon dioxide and then part of, or all of, the remaining silicon in silicon structures 136 may be further converted to silicon dioxide using the subsequent thermal oxidation process that is used to form oxide layer 482. Accordingly, the thickness of oxide layer 482 and the amount of silicon dioxide on the interior surfaces of cavity 124, and in silicon structures 136 may be controlled by varying the timing of the two thermal oxidation processes used to form oxide layer 134 and oxide layer 482.

Referring now to FIG. 4, dielectric layers 610 and 612 may be optionally removed. In the example shown in FIG. 4 dielectric layers 610 and 612 have been removed. After optional removal of dielectric layers 610 and 612, capping structure 116 is formed over cavities 124 (FIG. 10), dielectric material 134 and structures 136. Capping structure 116 may comprise one or more layers. In the embodiment shown in FIG. 4 capping structure is comprised of dielectric layers 415 and 420.

In some embodiments, dielectric layer 415 may comprise silicon dioxide and may be formed by low temperature chemical vapor deposition (CVD). Other suitable materials for dielectric layer 415 include silicon nitride, phosphorus silicate glass (PSG), boron phosphorus silicate glass (BPSG), an oxide formed using tetraethylorthosilicate (TEOS), or the like. Dielectric layer 415 may have a thickness ranging from about 1000 Angstroms to about 4 microns. Referring back to FIG. 10, during formation of dielectric layer 415 (FIG. 4) the material of the capping structure may enter a portion of cavities 124, but not fill cavities 124 due in part to the relatively small width of the cavities 124, thereby forming a capped or sealed cavity 124A (FIG. 4). Dielectric layer 415 (FIG. 4) may be optionally planarized using, for example, a Chemical Mechanical Planarization ("CMP") technique. In an alternate embodiment, the material of dielectric layer 415 (FIG. 4) may substantially or completely fill cavity 124.

Referring again to FIG. 4, an optional sealing layer 420 such as, for example, silicon nitride ($Si_3N_4$), may be formed over silicon dioxide layer 415 to hermetically seal cavity 124 (FIG. 10). In other words, in embodiments where dielectric layer 415 is a silicon dioxide layer, the optional conformal silicon nitride layer 420 may prevent diffusion through and/or fill in any openings or cracks in the silicon dioxide dielectric layer 415, and in general prevent the propagation of gases or moisture into sealed cavities 124A through dielectric layer 415. Silicon nitride layer 420 may be formed using a low pressure chemical vapor deposition (LPCVD) and may have a thickness of ranging from about 100 Angstroms to about 5000 Angstroms. In one embodiment, the thickness of silicon nitride layer 420 is about 500 Angstroms. A partial vacuum may be formed in sealed cavities 124A as part of the LPCVD process. If optional sealing layer 420 is used, the CMP is performed prior to the formation of optional sealing layer 420 since the CMP may completely remove the relatively thin sealing layer 420.

Accordingly, the capping or sealing of cavities 124 (FIG. 10) may be accomplished by forming a non-conformal material followed by a conformal material. In this example, the non-conformal layer such as, for example, layer 415, may enter into a portion of cavity 124 (FIG. 10), but not fill cavity 124 (FIG. 10) due in part to the relatively small size of the width of cavities 124 and since layer 415 is a non-conformal layer. Then a conformal material such as, for example, layer 420, may be formed on layer 415.

In some embodiments, sealed cavity 124A is evacuated to a pressure less than atmospheric pressure. In other words, the pressure in sealed cavity 124A is below atmospheric pressure. As an example, the pressure in sealed cavity 124A may range from approximately 0.1 Torr to approximately 10 Torr. The type of substance or material within sealed cavity 124A is not a limitation of the present invention. For example, cavity 124A may contain a gas, a fluid, or a solid matter.

Referring back to FIG. 4, the portions of capping structure 116, silicon nitride layer 612 and silicon dioxide layer 610 (if not removed previously) in active regions 106 and 107 are removed after the formation of capping layer structure 116. Active and passive semiconductor devices may be formed in or from the portions of substrate 410 adjacent DP 104. In addition, active or passive circuit elements, or portions thereof, may be formed on DP 104. Referring again to FIG. 4, a passive circuit element 140 is formed on DP 104.

Figure 17:
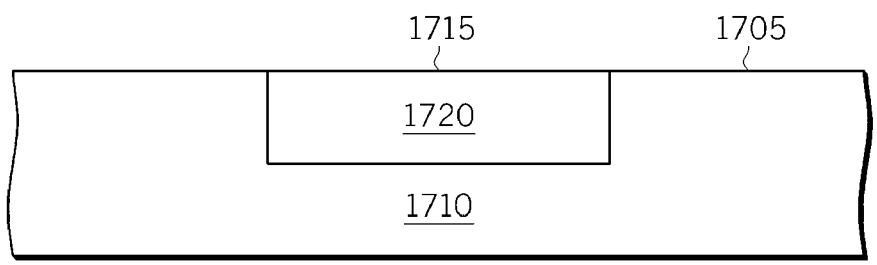
FIG. 17 is a cross-sectional view of another semiconductor structure in accordance with an embodiment of the present invention.

Referring back to FIG. 4, it should be noted that in some embodiments of this invention, the orientation of substrate 410 required to achieve a specific cavity profile using an orientation-dependent etch, may not be the most desirable orientation for devices made in active regions 106 and/or 107. In these cases, one can optionally modify the substrate to achieve one orientation in the dielectric platform area and one or more different orientations in one or more active regions. FIG. 17 shows an example of semiconductor structure 1700 at an early stage of fabrication, where substrate 1710, in which active devices may be fabricated, has a first orientation and region 1720, in which a dielectric platform may be fabricated, has a second orientation. For example, substrate 1710 is comprised of silicon oriented with surface 1705 perpendicular, or substantially perpendicular to the <100> direction of the crystal lattice of silicon substrate 1710, and region 1720 is comprised of silicon oriented with surface 1715 perpendicular, or substantially perpendicular to the <110> direction of the crystal lattice of silicon within region 1720.

Figure 18:
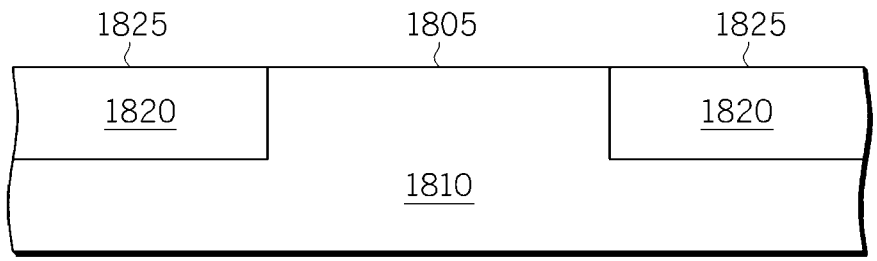
FIG. 18 is a cross-sectional view of another semiconductor structure in accordance with an embodiment of the present invention.

FIG. 18 shows an alternate example of semiconductor structure 1800 at an early stage of fabrication, where substrate 1810, in which a dielectric platform may be fabricated, has a first orientation and regions 1820, in which active devices may be fabricated, have a second orientation. For example, substrate 1810 is comprised of silicon oriented with surface 1805 perpendicular, or substantially perpendicular to the <110> direction of the crystal lattice of silicon substrate 1810 and regions 1820 are comprised of silicon oriented with surface 1825 perpendicular, or substantially perpendicular to the <100> direction of the crystal lattice of silicon within regions 1820.

The examples shown in FIGS. 17 and 18 demonstrate examples of substrates with regions of different orientations, at an early stage of fabrication, prior to fabrication of the dielectric platform. This is not a limitation of the present invention; formation of the orientation in one or more portions of the substrate can be performed at any point in the fabrication process. Furthermore, while the example shown in FIG. 17 shows a first region with a first orientation and a second region with a second orientation, and the example shown in FIG. 18 shows a first region with a first orientation and two second regions with a second orientation, this is not a limitation of the present invention.

Figure 19:
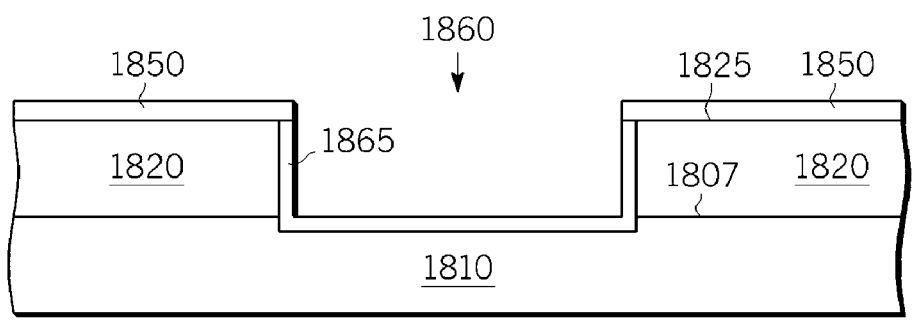
FIG. 19 is a cross-sectional view of the semiconductor structure of FIG. 20 at an early stage of fabrication in accordance with an embodiment of the present invention

In one example semiconductor structure 1800 shown in FIG. 18 may be fabricated using a combination of wafer bonding and epitaxial growth. FIG. 19 shows semiconductor structure 1800 at an early stage of manufacture. Semiconductor structure 1800 comprises semiconductor material 1810 comprised of silicon oriented with surface 1807 perpendicular, or substantially perpendicular to the <110> direction of the crystal lattice of silicon material 1810, semiconductor material 1820 comprised of silicon oriented with surface 1825 perpendicular, or substantially perpendicular to the <100> direction of the crystal lattice of silicon within semiconductor material 1820 and mask layer 1850. Semiconductor material 1820 may be formed over semiconductor material 1810, for example using wafer bonding. Mask layer 1850 may be formed over semiconductor material 1820 and may comprise, for example silicon dioxide, photoresist or silicon nitride. Mask layer 1850 may comprise, for example, silicon dioxide and has a thickness ranging from about 500 Angstroms (Å) to about 2 microns.

Referring to FIG. 19, mask layer 1850 and semiconductor material 1820 may be patterned and then portions of mask layer 1850 and semiconductor material 1820 above semiconductor material 1810 etched using an anisotropic etch process such as, for example, a reactive ion etch (RIE), to form a cavity 1860. After cavity 1860 is formed, dielectric layer 1865 is formed along the exposed interior surfaces of cavity 1860. In some embodiments, dielectric layer 1865 is an oxide layer such as silicon dioxide having a thickness ranging from about 50 Angstroms to about 5000 Angstroms. Oxide layer 1865 may be formed using deposition techniques or thermal growth techniques such as, for example, thermal oxidation of silicon.

Figure 20:
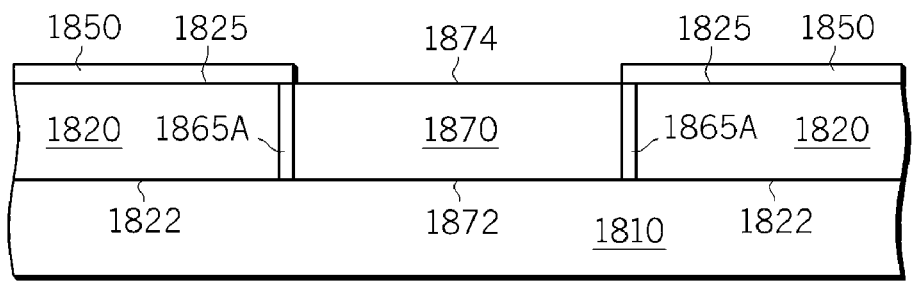
FIG. 20 is a cross-sectional view of another semiconductor structure in accordance with an embodiment of the present invention.

Referring now to FIG. 20, which shows semiconductor structure 1800 at a later stage of fabrication, the portions of dielectric layer 1865 (FIG. 19) that are parallel, or substantially parallel to surface 1825 are removed using an anisotropic etch, for example reactive ion etching, leaving only portions of dielectric layer 1865 (FIG. 19), referenced as 1865A in FIG. 20, which are perpendicular, or substantially perpendicular to surface 1825. Selective epitaxial growth is then performed in cavity 1860, resulting in the formation of semiconductor material 1870 over semiconductor material 1810 and between dielectric layers 1865A. Because semiconductor material 1870 is formed using epitaxial growth, it has the same orientation as semiconductor material 1810. Semiconductor material 1820 retains its original orientation. While interface 1872 is shown as coplanar, or substantially coplanar with interfaces 1822, this is not a limitation of the present invention. Furthermore while surface 1874 are shown as coplanar with surfaces 1825, this is not a limitation of the present invention.

Referring back to FIG. 4, although dielectric platform 104 is described as having one or more sealed cavities 124A, the methods and apparatuses described herein are not limited in this regard. For example, in alternate embodiments, sealed cavities 124A could be filled with a material, such as, for example, a material comprising an oxide, nitride, or silicon if so desired, to form a solid or filled dielectric platform (not shown) that is devoid of any cavities. Such a solid or filled dielectric platform would have a relatively higher dielectric constant compared to an air-gap dielectric platform such as dielectric platform 104 since the material used to fill sealed cavities 124A would have a higher dielectric constant compared to an opening or void. Examples of materials that may be used to fill, or backfill, sealed cavities 124A may include silicon nitride, polycrystalline silicon, or an oxide material formed using, for example, a hot wall TEOS process.

A portion of a dielectric material 415, a portion of a dielectric material 420, a portion of a dielectric materials 134, and vertical structures 136 in combination with sealed cavities 124A cooperate to form dielectric platform 104 shown in FIG. 4. Active and passive semiconductor devices may be formed in or from the portions of substrate 410 adjacent dielectric platform 104. In addition, active or passive circuit elements may be formed on dielectric platform 104. As an example, the passive component may comprise electrically conductive material 140 (FIG. 4), wherein electrically conductive material 140 may comprise, for example, aluminum, copper, or doped polycrystalline silicon. In various examples, the passive component may be an inductor, a capacitor, a resistor, or an electrical interconnect.

Accordingly, various structures and methods have been disclosed to provide a relatively thick, embedded dielectric platform that may be a dielectric support structure capable of supporting one or more passive devices over the dielectric platform. In various embodiments, the disclosed dielectric platform may provide electrical isolation, reduce parasitic substrate capacitance, allow for the formation of passive devices having a relatively high Q, and enable relatively higher frequency of operation or breakdown voltages of any devices formed using, or in conjunction with, a structure that includes the disclosed dielectric platform. In addition, the disclosed dielectric platform and the methods for making the dielectric platform may reduce stress that may be imparted to regions adjacent to the dielectric platform compared to other techniques and structures.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method to manufacture a semiconductor structure, comprising:
    removing a portion of a semiconductor material using an orientation-dependent etch to form a first cavity that extends at least about one micron or greater below the surface of the semiconductor material, a second cavity that extends at least about one micron or greater below the surface of the semiconductor material, wherein the first cavity is isolated from the second cavity, a first protrusion comprising a portion of the semiconductor material is between the first cavity and the second cavity, and the semiconductor material comprises silicon, wherein said removing results in the first cavity or the second cavity, or combinations thereof, to have sidewalls that are formed mainly by {111} planes of silicon crystal of the semiconductor material to be perpendicular, or substantially perpendicular, to a planar surface of the semiconductor material;
    performing a thermal oxidation to convert a portion of the silicon of the semiconductor material to silicon dioxide;
    forming a first dielectric material over the first cavity, over the second cavity, over at least a portion of the semiconductor material, and over at least a portion of the first protrusion, wherein the first dielectric material extends at least partially into the first cavity and the second cavity and caps the first cavity and the second cavity to create sealed voids having a lower dielectric constant than the semiconductor material; and forming at least a portion of an electrically conductive material over at least a portion of the first dielectric material such that the sealed voids provide a reduced capacitance between the electrically conductive material and the semiconductor material.

2. The method of claim 1, wherein the first dielectric material comprises an oxide.

3. The method of claim 1, wherein the first protrusion comprises silicon dioxide.

4. The method of claim 1, wherein a pressure in the first cavity is below atmospheric pressure.

5. The method of claim 1, further comprising forming at least a portion of an active device is in the semiconductor material.

6. The method of claim 1, wherein a sidewall of the first cavity is perpendicular to, or substantially perpendicular to, the surface of the semiconductor material.

7. The method of claim 1, wherein a sidewall of the first cavity is non-perpendicular to the surface of the semiconductor material.

8. The method of claim 1, wherein a first portion of the semiconductor material has a first orientation and a second portion of the semiconductor material has a second orientation.

9. The method of claim 1, wherein the orientation-dependent etch is a potassium hydroxide-based (KOH) etch, an ethylene diamine pyrocatechol-based (EDP) etch, a tetramethylammonium hydroxide-based (TMAH) etch, or a hydrazine-based etch.

10. The method of claim 1, further comprising using wafer bonding to form a second semiconductor coupled to the semiconductor material.

11. The method of claim 1, further comprising:

forming a second dielectric material over the first dielectric material; and forming at least a portion of an electrically conductive material over at least a portion of the second dielectric material, wherein the semiconductor material comprises silicon, the semiconductor material comprises one or more epitaxial layers, the first protrusion comprises silicon dioxide, the first dielectric material comprises silicon dioxide, the second dielectric material comprises silicon nitride ($Si_3N_4$), and the electrically conductive material comprises aluminum, copper, or doped polycrystalline silicon.

12. The method of claim 1, further comprising planarizing the first dielectric material using a Chemical Mechanical Planarization ("CMP") process.

* * * * *